(12) United States Patent
Hsu et al.

(10) Patent No.: US 12,154,947 B2
(45) Date of Patent: Nov. 26, 2024

(54) METHODS OF FORMING EPITAXIAL SOURCE/DRAIN FEATURES IN SEMICONDUCTOR DEVICES

(71) Applicant: Taiwan Semiconductor Manufacturing Co., Ltd., Hsin-Chu (TW)

(72) Inventors: Tzu-Hsiang Hsu, Hsinchu County (TW); Ting-Yeh Chen, Hsinchu (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/705,540

(22) Filed: Mar. 28, 2022

(65) Prior Publication Data

US 2022/0223689 A1  Jul. 14, 2022

Related U.S. Application Data

(62) Division of application No. 16/727,766, filed on Dec. 26, 2019, now Pat. No. 11,289,574.

(51) Int. Cl.
| | |
|---|---|
| *H01L 29/08* | (2006.01) |
| *H01L 21/8234* | (2006.01) |
| *H01L 27/088* | (2006.01) |
| *H01L 29/66* | (2006.01) |
| *H01L 29/78* | (2006.01) |

(52) U.S. Cl.
CPC .. *H01L 29/0847* (2013.01); *H01L 21/823418* (2013.01); *H01L 21/823431* (2013.01); *H01L 27/0886* (2013.01); *H01L 29/66795* (2013.01); *H01L 29/785* (2013.01)

(58) Field of Classification Search
CPC ......... H01L 29/0847; H01L 21/823418; H01L 21/823431; H01L 27/0886; H01L 29/66795; H01L 29/785; H01L 29/165; H01L 29/0653; H01L 29/66545; H01L 29/7848
USPC ........................................................ 257/372
See application file for complete search history.

(56) References Cited

U.S. PATENT DOCUMENTS

| | | | |
|---|---|---|---|
| 10,249,742 B2 | 4/2019 | Le | |
| 2013/0240989 A1* | 9/2013 | Glass | .................... H01L 29/785 |
| | | | 438/197 |
| 2013/0270638 A1 | 10/2013 | Adam | |
| 2014/0193960 A1* | 7/2014 | Fukuda | ............. H01L 21/76283 |
| | | | 438/296 |
| 2014/0346600 A1 | 11/2014 | Cheng | |

(Continued)

*Primary Examiner* — Mohammad M Hoque
(74) *Attorney, Agent, or Firm* — HAYNES AND BOONE, LLP

(57) ABSTRACT

A semiconductor structure includes a semiconductor fin disposed over a substrate, a metal gate stack disposed over the semiconductor fin, an epitaxial source/drain (S/D) feature disposed over the semiconductor fin and adjacent to the metal gate stack, and a dielectric feature embedded in the semiconductor fin, where a bottom surface of the epitaxial S/D feature is disposed on a top surface of the dielectric feature, and where sidewalls of the epitaxial S/D feature extend to define sidewalls of the dielectric feature.

20 Claims, 18 Drawing Sheets

(56) References Cited

U.S. PATENT DOCUMENTS

| | | |
|---|---|---|
| 2015/0162436 A1 | 6/2015 | Toh |
| 2015/0221761 A1 | 8/2015 | Tan |
| 2015/0255607 A1* | 9/2015 | Lim .................... H01L 29/7834 |
| | | 257/192 |
| 2015/0340490 A1 | 11/2015 | An |
| 2016/0218104 A1 | 7/2016 | Wen |
| 2018/0331184 A1 | 11/2018 | Glass |
| 2019/0181220 A1 | 6/2019 | Cheng |
| 2019/0198658 A1 | 6/2019 | Mohapatra |
| 2020/0091287 A1* | 3/2020 | Glass ................. H01L 29/1079 |
| 2020/0168736 A1* | 5/2020 | Lu ....................... H01L 21/0262 |
| 2020/0220017 A1 | 7/2020 | Rachmady |
| 2020/0279916 A1 | 9/2020 | Rachmady |

\* cited by examiner

METHODS OF FORMING EPITAXIAL SOURCE/DRAIN FEATURES IN SEMICONDUCTOR DEVICES

CROSS-REFERENCE TO RELATED APPLICATIONS

This application is a divisional of U.S. Non-Provisional Patent Application Ser. No. 16/727,766, filed Dec. 26, 2019, and titled "Methods of Forming Epitaxial Source/Drain Features in Semiconductor Devices," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of epitaxial source/drain (S/D) features becomes more challenging as feature sizes continue to decrease. In particular, it remains a main object of semiconductor device fabrication to reduce short-channel effects (SCEs) such as drain-induced barrier lowering or DIBL, especially for devices that include heavily doped S/D features. While current methods of forming epitaxial S/D features are generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
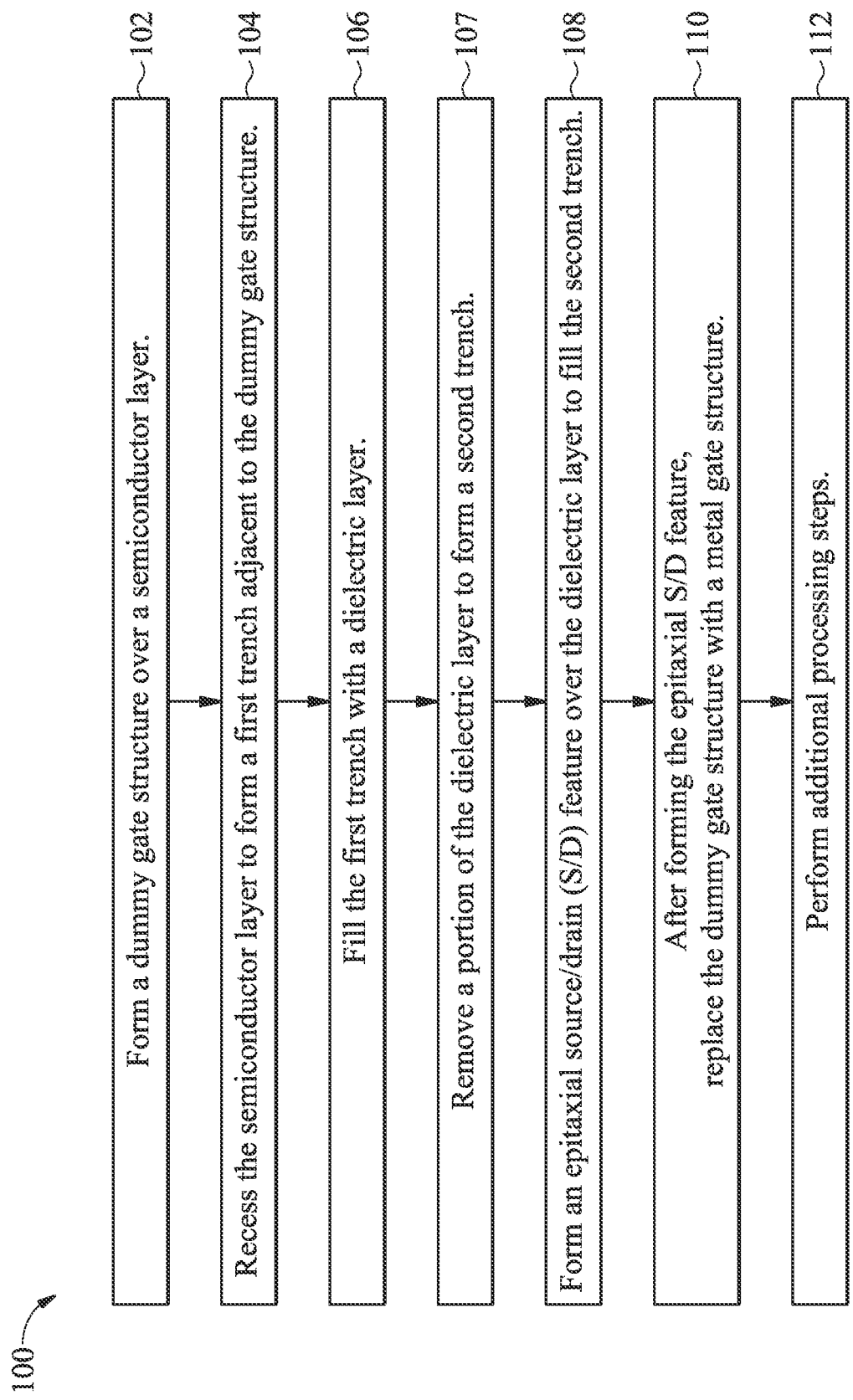
FIG. 1 is an embodiment of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs or three-dimensional fin-like FETs (FinFETs). It is an objective of the present disclosure to provide methods of forming epitaxial source/drain features in FETs.

In FET fabrication, epitaxial source/drain (S/D) features are generally doped with n-type or p-type dopants to ensure proper device performance during operation. In some instances, it is desirable to form heavily doped S/D features in order to reduce resistivity of the S/D features and/or reduce resistance at interface with subsequently formed S/D contacts. However, as device dimension continues to decrease, short-channel effects (SCEs) such as drain-induced barrier lowering, or DIBL, may be exacerbated by the presence of heavily doped S/D features having lower resistivity. In some instances, portions of the heavily doped S/D features farther away from a channel region of the device may be especially prone to the effect of DIBL and current leakage due to diffusion of the dopants. While measures have been taken in fabricating FETs to mitigate SCE, they have not been entirely satisfactory in all aspects.

Figure 2:
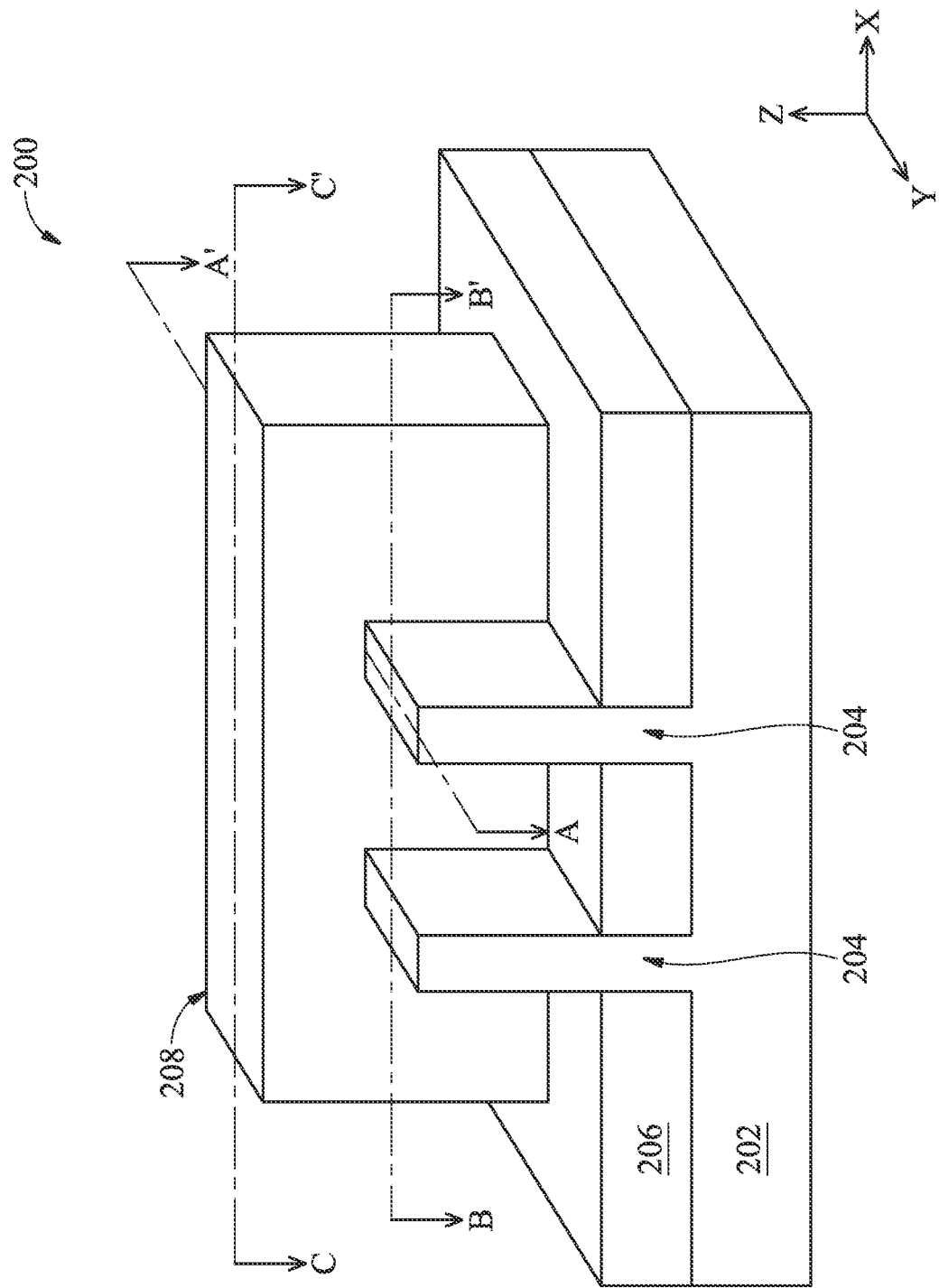
FIG. 2 is a perspective view of an embodiment of a semiconductor device according to various aspects of the present disclosure.
Figure 3A:
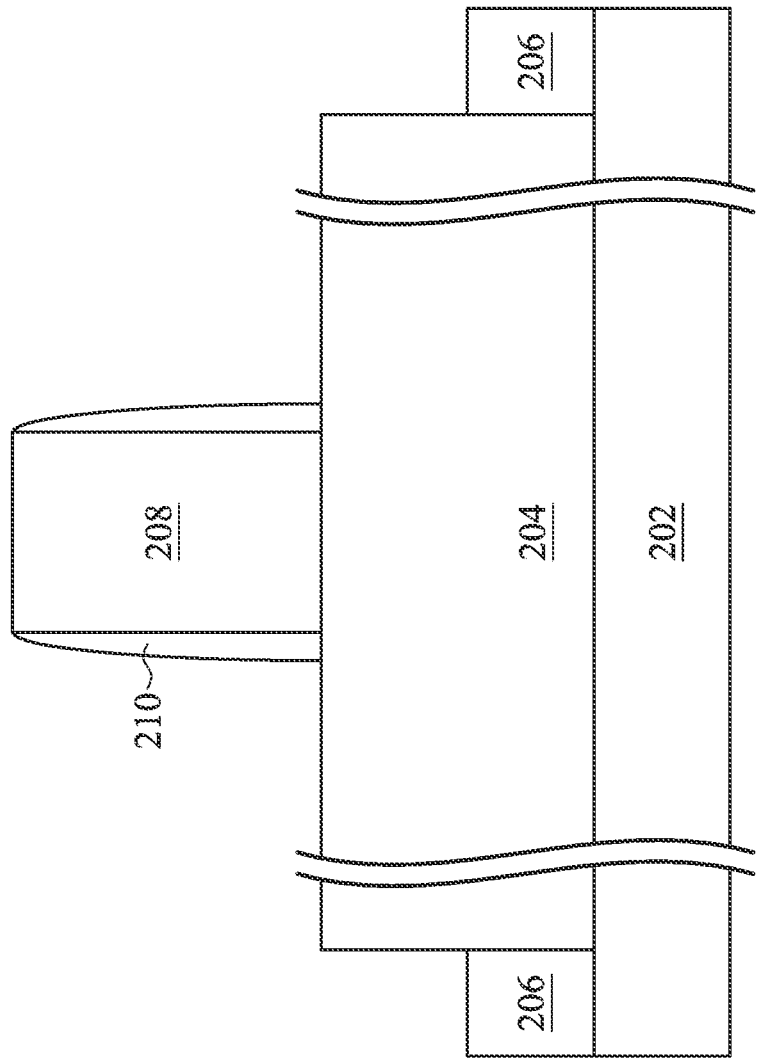
FIGS. 3A, 4A, 5A, 5B, 6A, 6B, 7A, 8A, and 8B are cross-sectional views of an embodiment of the semiconductor device of FIG. 2 along line AA' during intermediate steps of the method of FIG. 1 according to various aspects of the present disclosure.
Figure 3C:
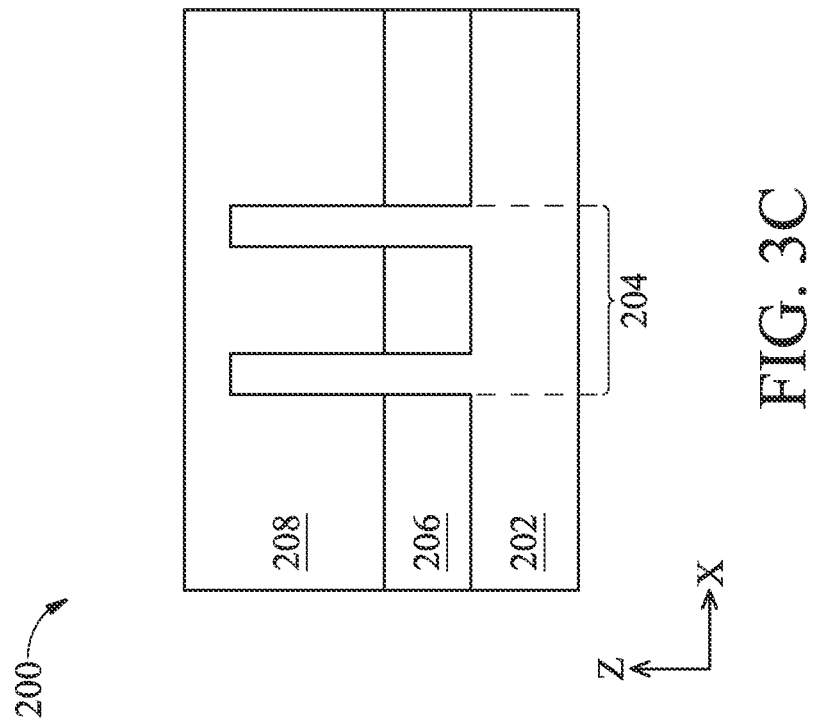
FIGS. 3C, 7C, and 8E are cross-sectional views of an embodiment of the semiconductor device of FIG. 2 along line CC' during intermediate steps of the method of FIG. 1 according to various aspects of the present disclosure.
Figure 3B:
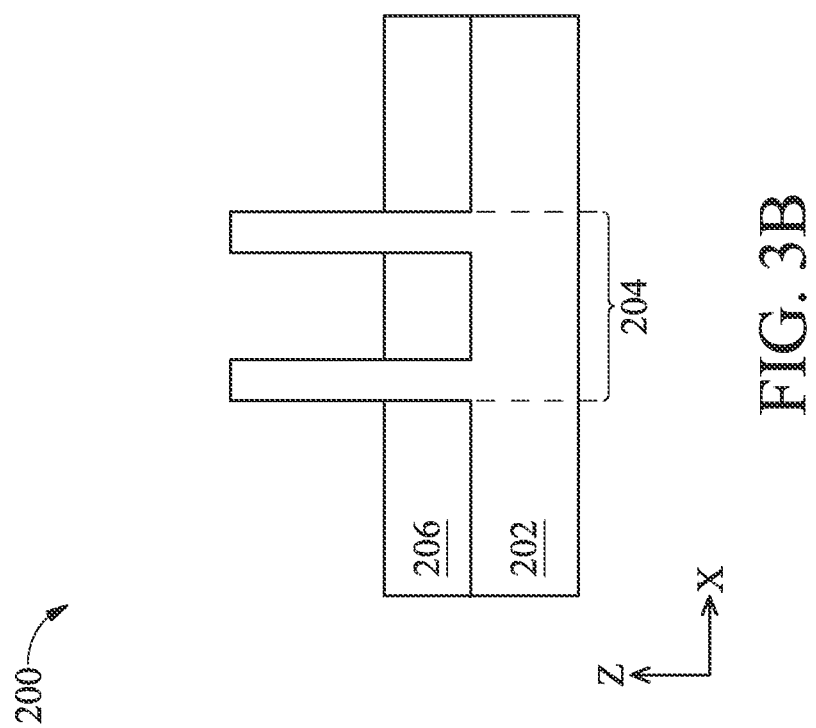
FIGS. 3B, 4B, 5C, 5D, 6C, 7B, 8C, and 8D are cross-sectional views of an embodiment of the semiconductor device of FIG. 2 along line BB' during intermediate steps of the method of FIG. 1 according to various aspects of the present disclosure.

FIG. 1 illustrates a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-8E, which illustrate a portion of the semiconductor device (hereafter referred to as the device) 200 during intermediate steps of the method 100. FIG. 2 is a three-dimensional perspective view of the device 200. FIGS. 3A, 4A, 5A-5B, 6A-6B, 7A, and 8A-8B are cross-sectional views of the device 200 taken along line AA' as illustrated in FIG. 2; FIGS. 3B, 4B, 5C-5D, 6C, 7B, and 8C-8D are cross-sectional views of the device 200 taken along line BB' as illustrated in FIG. 2; and FIGS. 3C, 7C, and 8E are cross-sectional views of the device 200 taken along line CC' as illustrated in FIG. 2. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET, the present disclosure may also provide embodiments for fabricating planar FETs.

At operation 102, referring to FIGS. 1, 2, and 3A-3C, the method 100 provides, or is provided with, the device 200 that includes a substrate 202 having semiconductor layers 204 (hereafter referred to as fins 204) disposed thereover. In some examples, the device 200 includes multiple semiconductor layers 204 that are substantially parallel to each other. The device 200 further includes a dummy gate structure 208 disposed over channel regions of the fins 204, gate spacers 210 disposed on sidewalls of the dummy gate structure 208, and isolation structures 206 disposed over the substrate 202 separating various components of the device 200. Throughout the subsequent discussion of the present disclosure, the cross-sectional views of the device 200 taken along the line AA' depict features as seen lengthwise along the direction of the fins 204, those taken along the line BB' depict features as seen in a direction generally perpendicular to the direction of the fins 204 and through a source/drain (S/D) region of the fins 204, and those taken along the line CC' depict features as seen in a direction generally perpendicular to the direction of the fins 204 and through a channel region of the fins 204. It is noted that the cross-sectional views taken along the line CC' are omitted if portions of the device 200 depicted therein remain substantially unchanged during the intermediate steps of the method 100.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as S/D regions, are disposed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 206 may include silicon oxide, silicon nitride, silicon oxynitride, fluoride-doped silicate glass (FSG), a low-k dielectric material, and/or other suitable materials. The isolation structures 206 may include shallow trench isolation (STI) features. In one embodiment, the isolation structures 206 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 206. Alternatively, the isolation structures 206 may include a multi-layer structure, for example, having one or more thermal oxide liner layers. The isolation structures 206 may be deposited by any suitable method, such as chemical vapor deposition (CVD), flowable CVD (FCVD), spin-on-glass (SOG), other suitable methods, or combinations thereof.

The dummy gate structure 208 is provided as a placeholder for a high-k metal gate structure (HKMG) to be formed after other components of the device 200 are fabricated. The dummy gate structure 208 may include at least a polysilicon layer and, in some examples, an interfacial layer (not depicted) interposing between the polysilicon layer and the channel regions of each fin 204. The dummy gate structure 208 may be formed by first depositing a blanket of polysilicon layer over the device 200 and then performing an etching process to remove portions of the polysilicon layer from the device 200 to form a portion of the dummy gate structure 208. After forming components such as the S/D features, at least portions of the dummy gate structure 208 are replaced with the HKMG in a series of processes to be discussed in detail below.

The gate spacers 210 may include a dielectric material, such as silicon oxide, silicon nitride, silicon carbide, silicon oxynitride, other suitable dielectric materials, or combinations thereof. The gate spacers 210 may be a single layered structure or a multi-layered structure. The gate spacers 210 may be formed by first depositing a blanket of spacer material over the device 200 and then performing an anisotropic etching process to remove portions of the spacer material to form the gate spacers 210 on the sidewalls of the dummy gate structure 208.

Figure 4A:
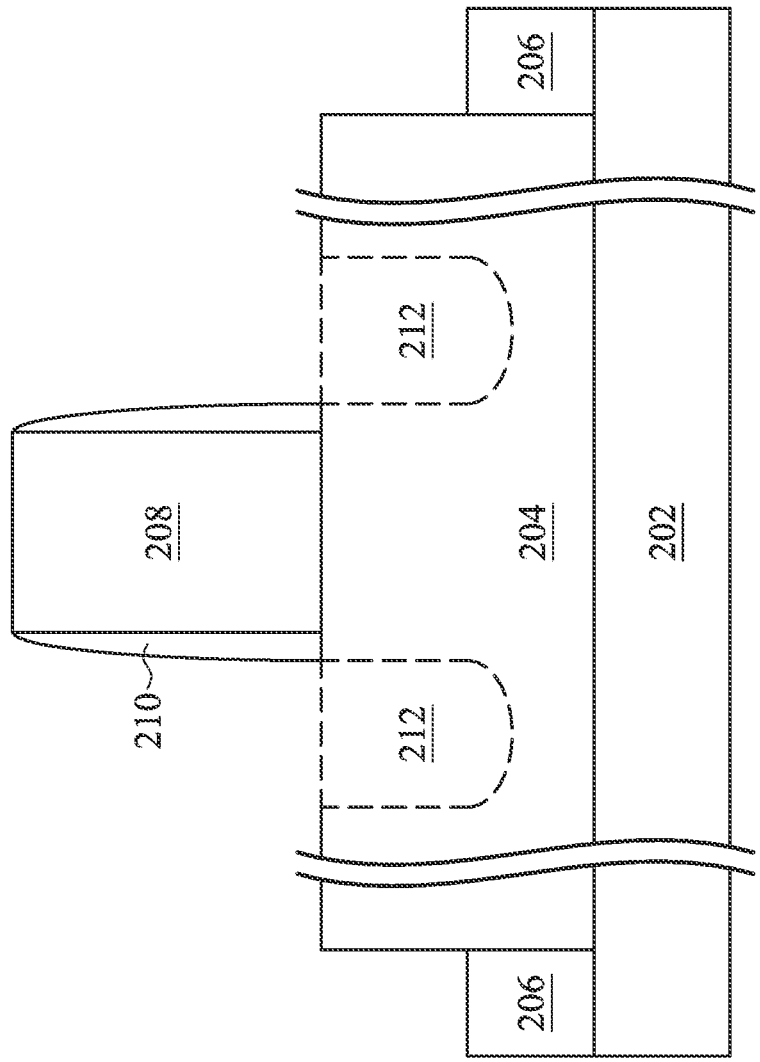
Figure 4B:
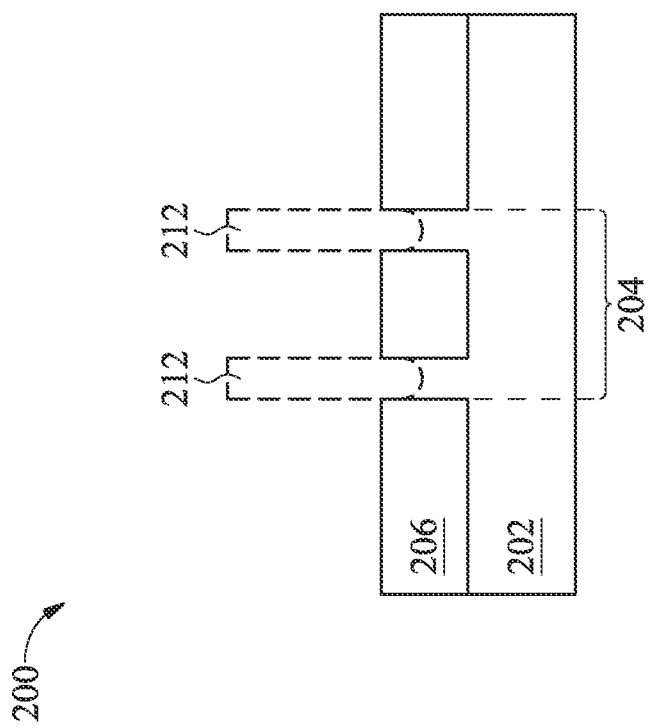

Now referring to FIGS. 1 and 4A-4B, the method 100 at operation 104 forms a trench 212 in S/D regions of the fin 204. In the present embodiments, the method 100 recesses portions of the fins 204 in a series of patterning and etching processes. For example, a masking element (not depicted) that includes at least a resist layer (e.g., a photoresist layer) may be applied over the device 200 and subsequently exposed to a radiation source through a lithographic mask. The exposed masking element may then be developed to form a patterned masking element that exposes the S/D regions of the fin 204 in the trench 212. Thereafter, the method 100 implements an etching process such as a dry etching process, a wet etching process, a reactive ion etching (RIE) process, other suitable etching processes, or combinations thereof using the patterned masking element as an etch mask. In some embodiments, the etching process is a dry etching process that employs one or more etchant, such as a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, an oxygen-containing gas (e.g., $O_2$), a nitrogen-containing gas (e.g., $N_2$), a helium-containing gas, an argon-containing gas, other suitable gases, or combinations thereof. After performing the etching process, the patterned masking element is removed from the device 200 by any suitable method such as resist stripping, wet etching, and/or plasma ashing. In some embodiments, as depicted herein, the etching process forms a rounded profile at a bottom surface of the trench 212; of course, the present embodiments are not limited to this configuration. In the depicted embodiments, the trench 212 extends to below a top surface of the isolation structures 206. In some embodiments, a bottom surface of the trench 212 is above the top surface of the isolation structures 206. As depicted herein, the trench 212 may be formed to a depth 213 measured from a top surface of the fin 204.

Figure 5A:
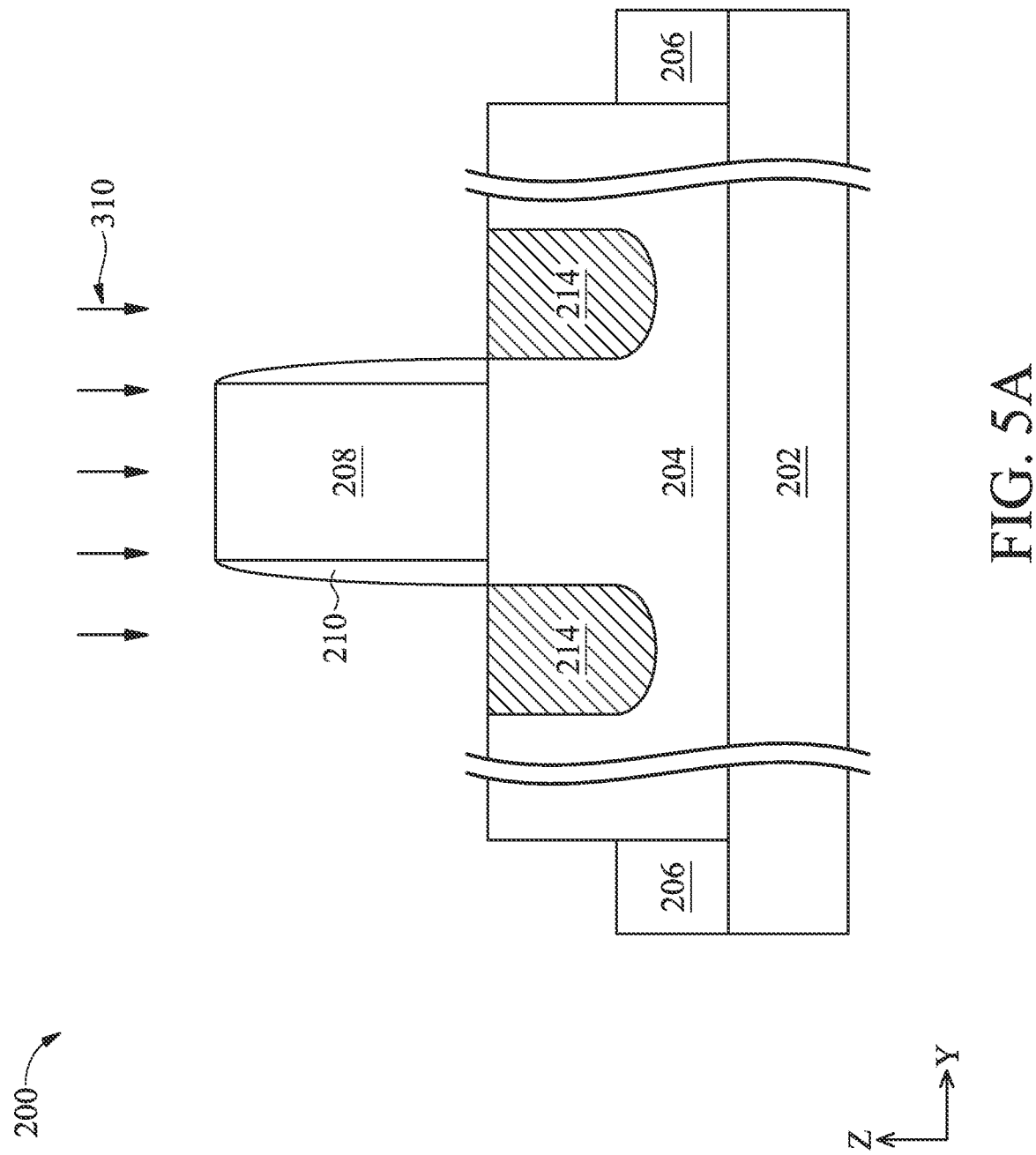
Figure 5B:
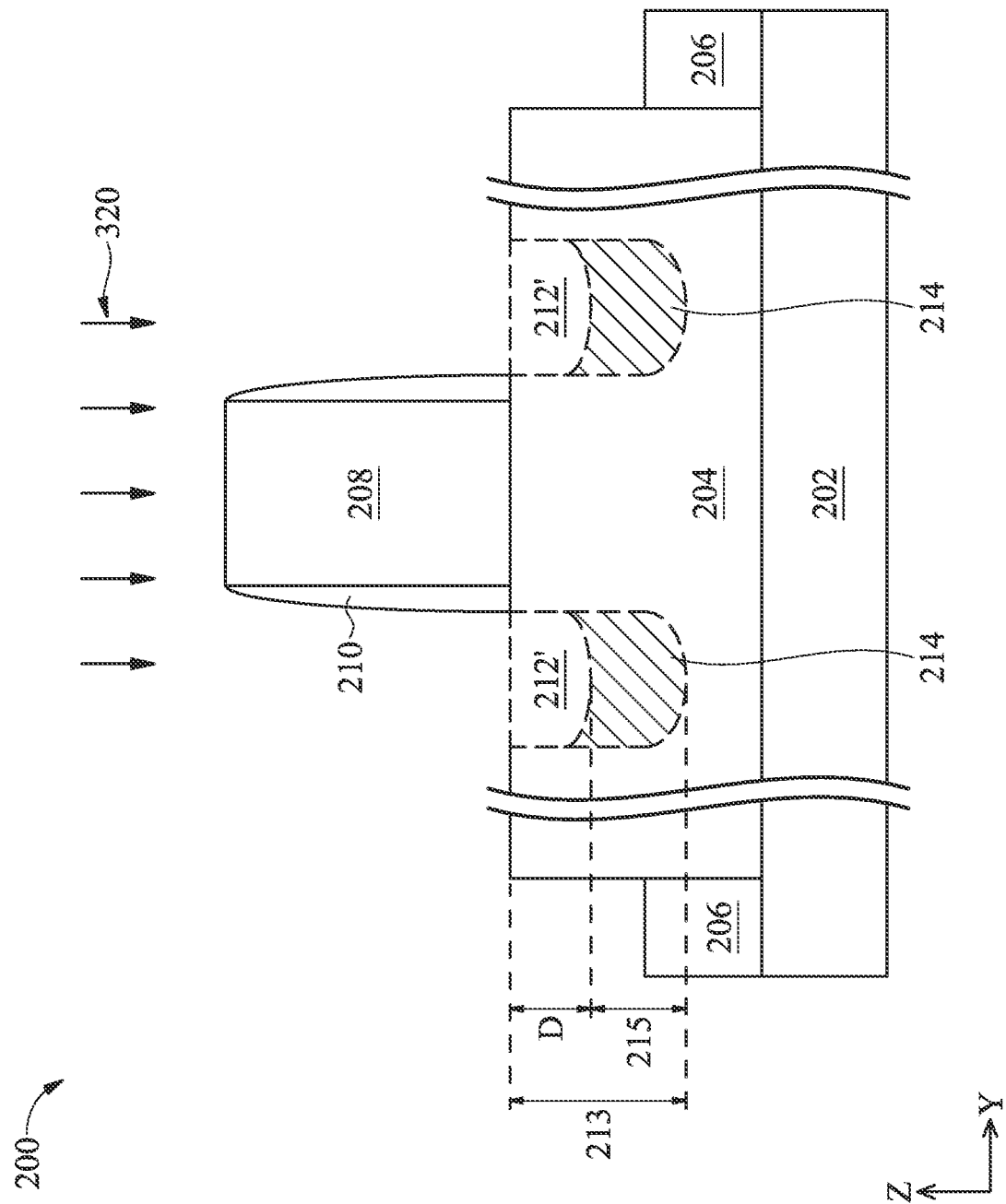

Referring to FIGS. 1 and 5A-5D, the method 100 at operations 106 and 107 forms a dielectric layer 214 in the trench 212, such that the dielectric layer 214 partially fills the trench 212. In other words, after implementing the operation 107, a top surface of the dielectric layer 214 is below a top surface of the fins 204. The dielectric layer 214 may include a dielectric material such as silicon oxide, silicon nitride, silicon carbide, silicon oxynitride, other suitable dielectric materials, or combinations thereof. In the present embodiments, the dielectric layer 214 includes silicon oxide. In further embodiments, the dielectric layer 214 includes amorphous silicon oxide. In the present embodiments, the method 100 implements a deposition process 310 (FIG. 5A) at operation 106 followed by an etching process 320 (FIG. 5B) at operation 107 to form the dielectric layer 214. The deposition process 310 may be any suitable process, such as CVD, ALD, other suitable processes, or combinations thereof. In the present embodiments, the deposition process 310 is a CVD process. In the present embodiments, the method 100 implements the deposition process 310 to fill the trench 212 with the dielectric layer 214 and subsequently performs the etching process 320 to remove a top portion of the dielectric layer 214, thereby forming a trench 212'. The duration of the deposition process 310 as well as the duration of the etching process 320 may each be controlled such that a desired thickness 215 of the dielectric layer 214 is achieved. As depicted in FIG. 5B, a top surface of the dielectric layer 214 may be curved; alternatively, the top surface of the dielectric layer 214 may be substantially flat. Notably, forming the dielectric layer 214 in a bottom portion of the trench 212 before forming the epitaxial S/D feature provides an insulating layer for retarding any potential diffusion of dopants between S/D regions of the device 200, thereby preventing any current leakage therebetween and mitigating the effect of DIBL brought about by the reduced device dimension (i.e., shortened channel length).

In the present embodiments, a ratio of the thickness 215 to the depth 213 is about 2:5 to about 1:2. Notably, if the ratio exceeds about 1:2, i.e., the dielectric layer 214 is too thick, the presence of the dielectric layer 214 may interfere with the mobility of charge carriers in the channel region (i.e., between the S/D regions) of the device 200. On the other hand, if the ratio is less than about 2:5, the effect of the dielectric layer 214 on retarding dopant diffusion between the S/D regions may be diminished. In some examples, the thickness 215 is at least about 10 nm but less than about 75 nm. In some examples, the thickness 215 may be about 40 nm to about 50 nm. Furthermore, as depicted in FIG. 5B, a distance D corresponds to a separation distance between the dielectric layer 214 and the channel region (i.e., a difference between the depth 213 and the thickness 215). In the present embodiments, the distance D measures at least 25 nm to ensure that the dielectric layer 214 does not interfere with the mobility of the charge carriers across the channel region.

Figure 5C:
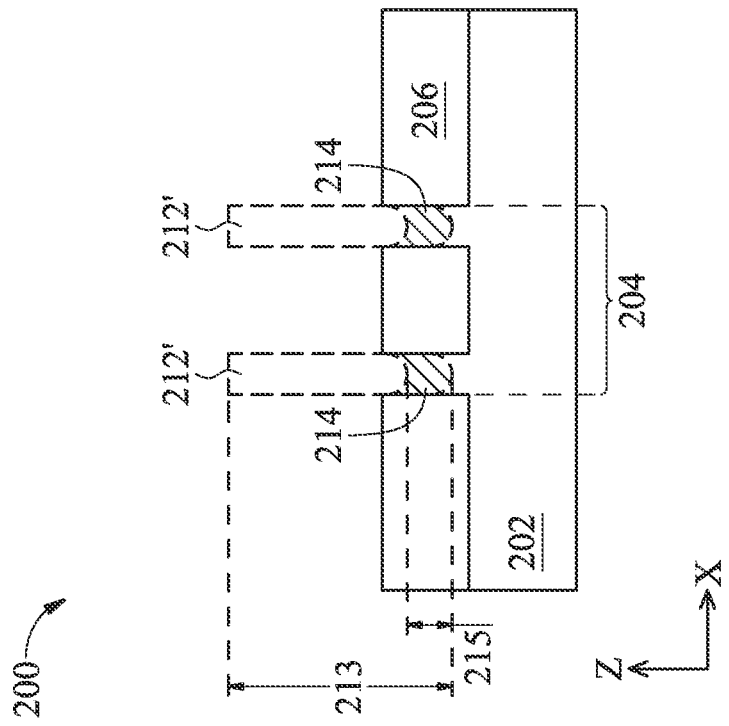
Figure 5D:
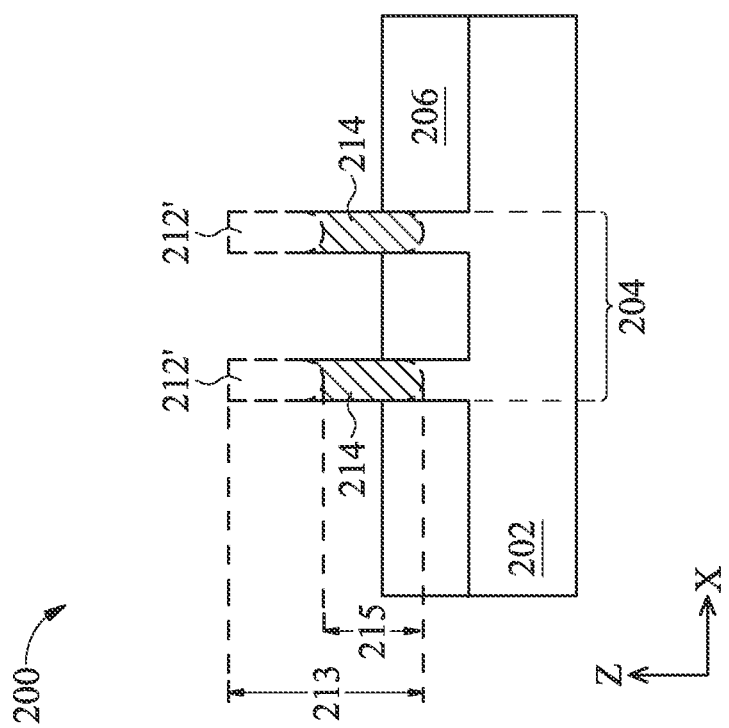

In some embodiments, referring to FIG. 5C, the top surface of the dielectric layer 214 is above a top surface of the isolation structures 206. Alternatively, referring to FIG. 5D, the top surface of the dielectric layer 214 may be below the top surface of the isolation structures 206. It is understood that the subsequent operations of the method 100 are equally applicable for the example embodiments depicted in FIGS. 5C and 5D; however, for purposes of clarity, the following description of the present disclosure will be discussed with reference to the example embodiment depicted in FIG. 5C.

Figure 6A:
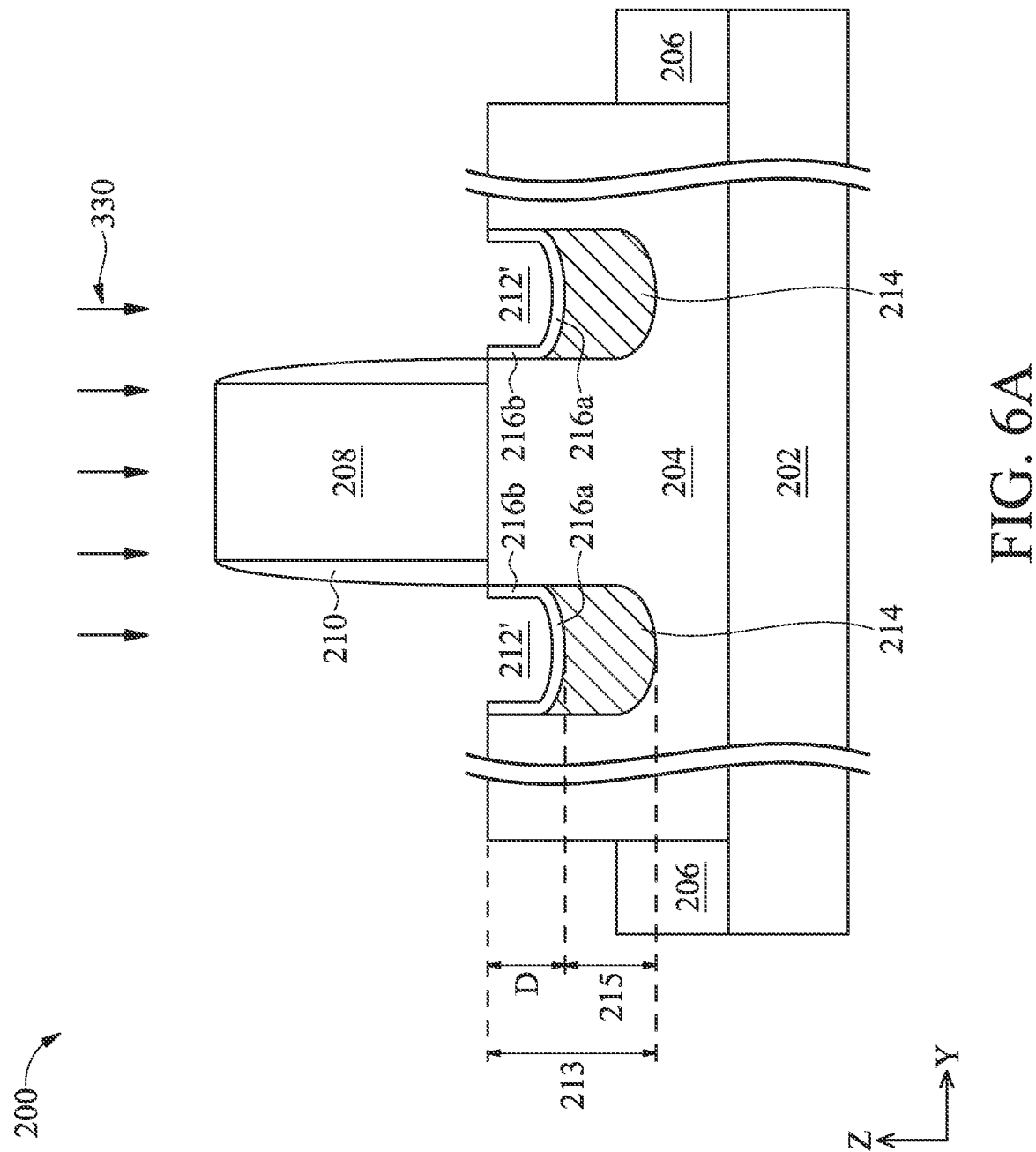
Figure 6B:
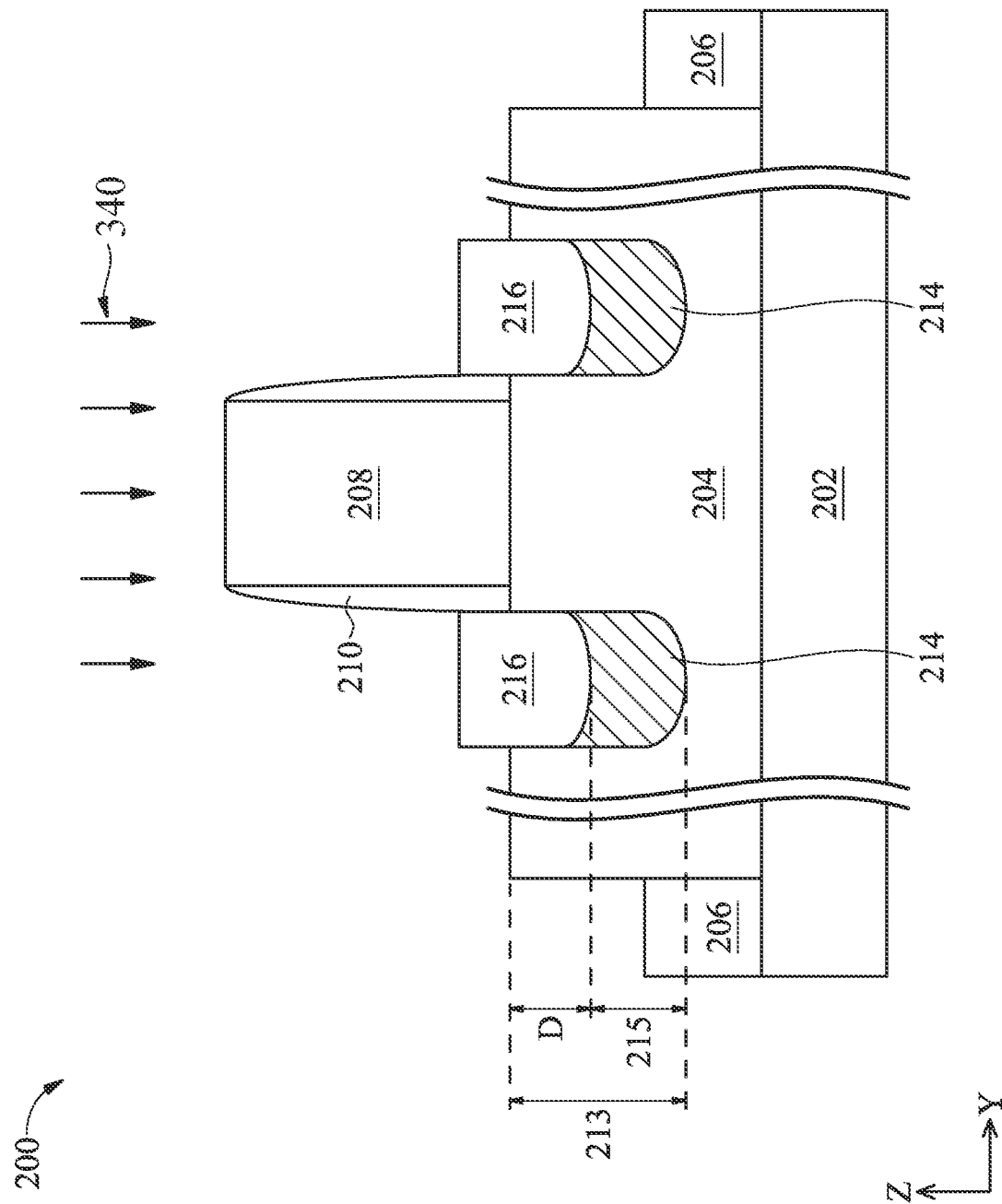
Figure 6C:
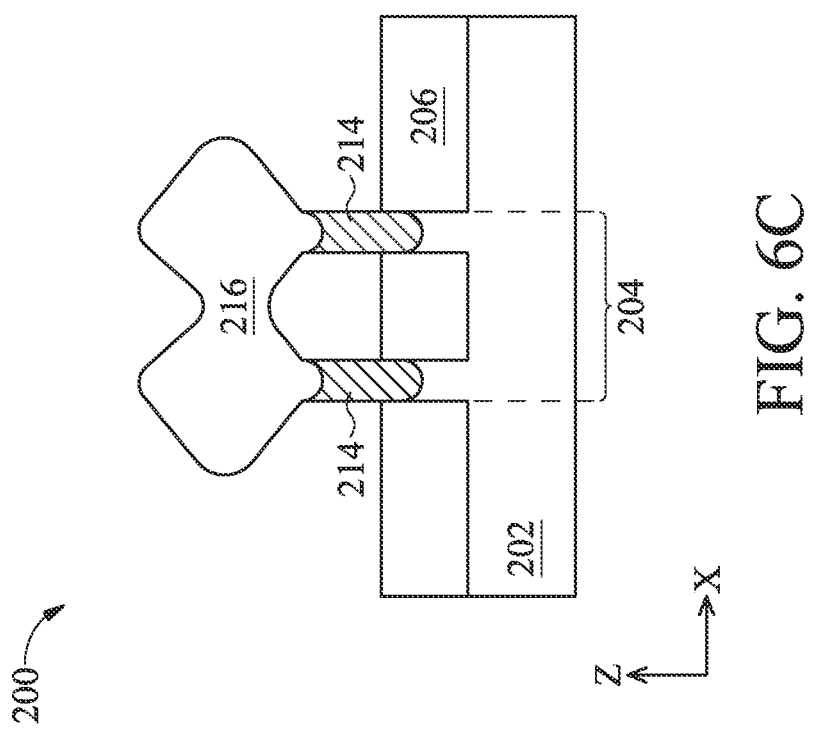

In some embodiments, referring to FIGS. 6A-6C, the method 100 at operation 108 forms epitaxial S/D features 216 in the trench 212'. In the present embodiments, referring to FIG. 6A, the method 100 may first deposit a buffer layer that includes a bottom portion 216a over the dielectric layer 214 and sidewall portions 216b over the sidewalls of the trench 212' in a first deposition process 330. In the present embodiments, the buffer layer includes an un-doped semiconductor material that corresponds to a conductivity type of the device 200. For example, if the device 200 is a p-type device, then the buffer layer may include un-doped silicon-germanium (SiGe), and if the device 200 is an n-type device, then the buffer layer may include un-doped silicon (Si) or silicon-carbon (SiC). In some embodiments, the subsequently-formed epitaxial S/D features 216 includes the same semiconductor material as the buffer layer but doped with one or more dopant. In the present embodiments, the buffer layer is configured as a semiconductor-based interface for growing the epitaxial S/D features 216. The buffer layer may be formed by performing a deposition process such as ALD with no dopants applied in-situ. Notably, the buffer layer has little to no effect on the performance of the device because current conduction between the epitaxial S/D features 216 does not rely on bottom portions of the S/D features but rather through the channel region between the S/D features.

Subsequently, referring to FIG. 6B, the method 100 proceeds to forming the epitaxial S/D features 216 over the bottom portion 216a and the sidewall portions 216b of the buffer layer in a second deposition process 340. The epitaxial S/D features 216 may be formed by an in-situ doped epitaxial growth process or, alternatively, by a series of deposition processes followed by an implantation process. In the present embodiments, the method 100 performs an in-situ doping process that includes a selective epitaxial growth (SEG) process implemented during an ALD process; of course, other suitable deposition processes such as CVD, molecular beam epitaxy (MBE), and/or other suitable processes may also be applicable. The SEG process may use one or more gaseous precursor (e.g., a silicon-containing gas, such as $SiH_4$, and/or a germanium-containing gas, such as $GeH_4$), a liquid precursor, other suitable precursors, or combinations thereof to form the epitaxial S/D features 216 while applying a suitable dopant. For example, the SEG process may form a silicon (Si) or silicon-carbon (SiC) layer doped with an n-type dopant such as phosphorous, arsenic, other suitable n-type dopants, or combinations thereof. Alternatively, the SEG process may form a silicon-germanium (SiGe) layer doped with a p-type dopant such as boron, other suitable p-type dopants, or combinations thereof. It is understood that the present disclosure is not limited to forming epitaxial S/D features having any specific conductivity type (e.g., p-type or n-type) or with specific level (e.g., heavily doped or lightly doped) of dopant concentration. Notably, forming the buffer layer between the dielectric layer 214 and the epitaxial S/D features 216 may enable more ordered epitaxial growth during the second deposition process 340, thereby ensuring proper performance of the device 200. In some embodiments, the method 100 subsequently performs an annealing process to the epitaxial S/D features 216 to activate the dopant(s) applied during the in-situ doping process. The annealing process may be a rapid thermal annealing (RTA) process, a laser annealing process, other suitable annealing processes, or combinations thereof.

For embodiments in which a three-dimensional FinFET is provided in the device 200, the method 100 at operation 108 forms raised epitaxial S/D features 216 that extend along the direction of the fin 204 (see FIG. 6C); of course, the present disclosure also provides embodiments in which the epitaxial S/D features 216 are substantially planar. Still referring to FIG. 6C, the present disclosure contemplates embodiments in which each epitaxial S/D feature 216 merges two neighboring fins 204 together. It is understood that other configurations, such as non-merged S/D features, are also within the scope of the present disclosure. Furthermore, the present disclosure does not limit the type of devices provided by the epitaxial S/D features 216. For example, the epitaxial S/D features 216 may be configured to provide n-type FETs or p-type FETs, depending upon specific design requirements.

Figure 7A:
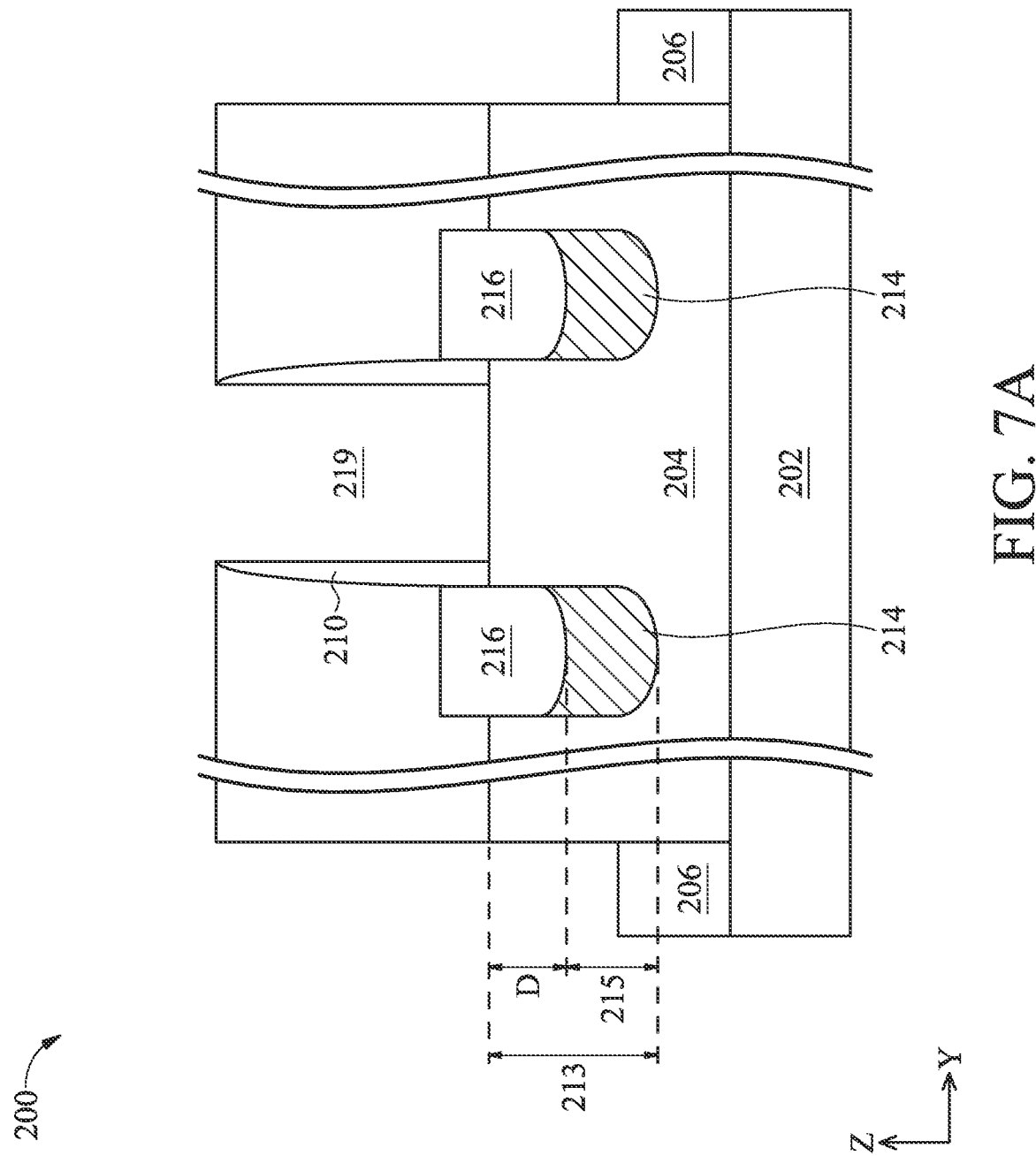
Figure 7B:
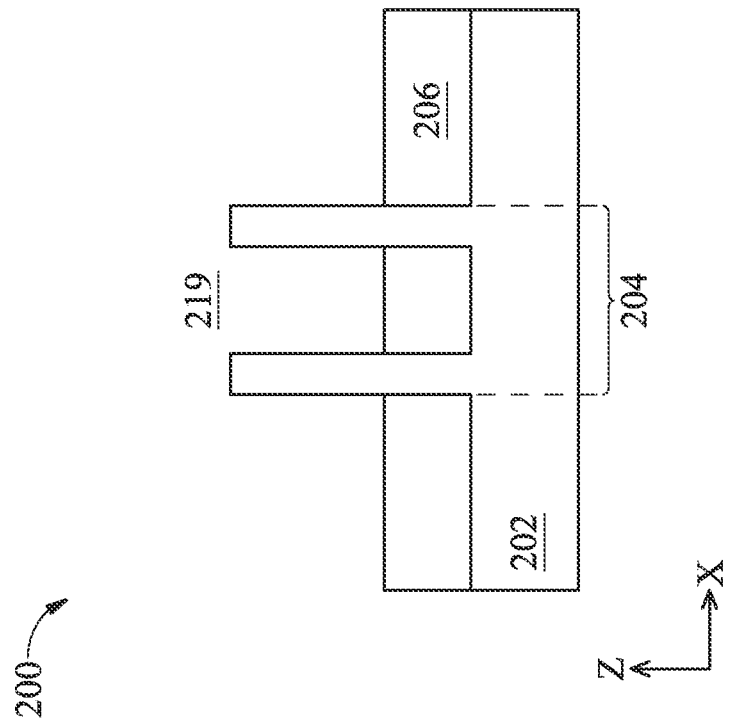
Figure 7C:
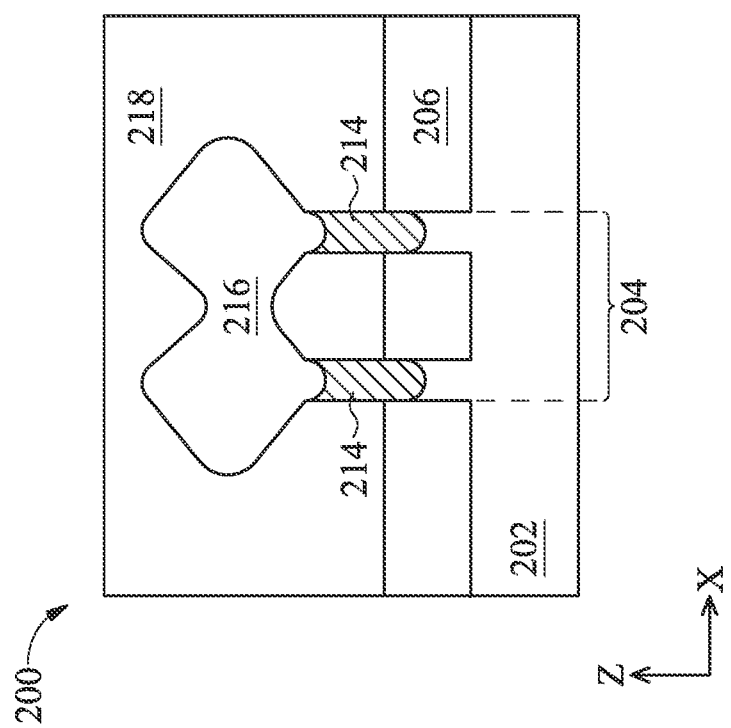
Figure 8A:
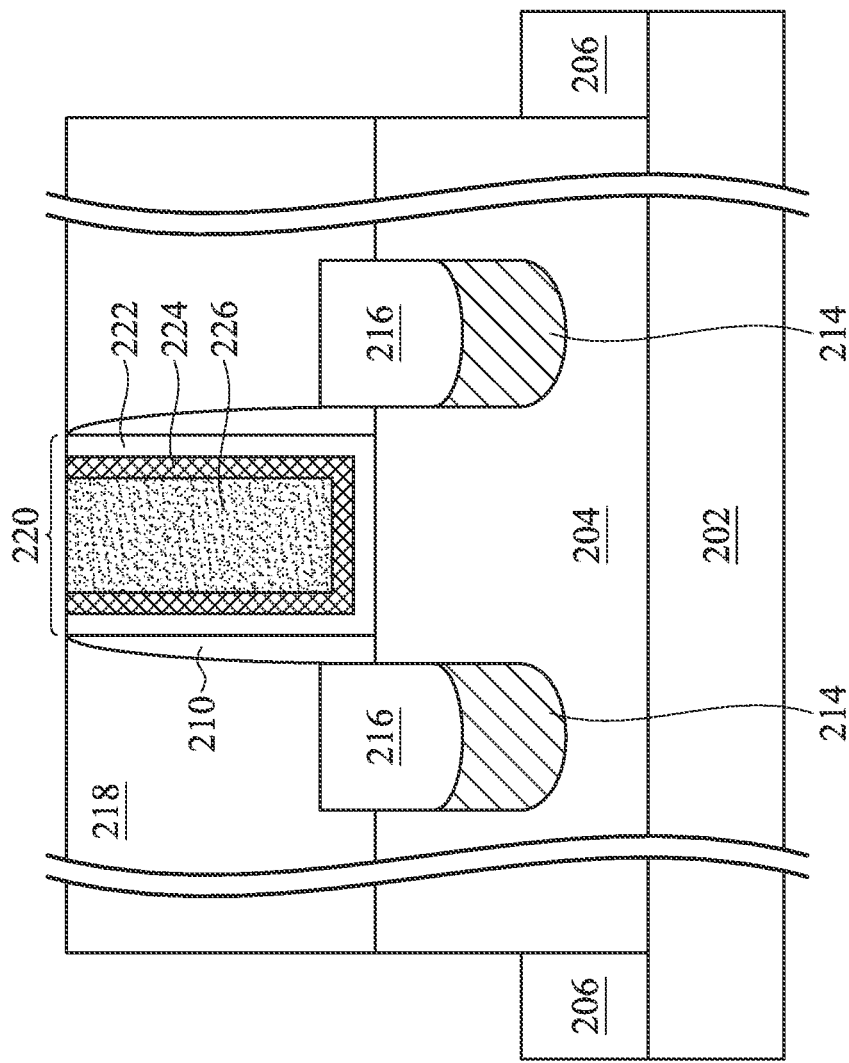
Figure 8B:
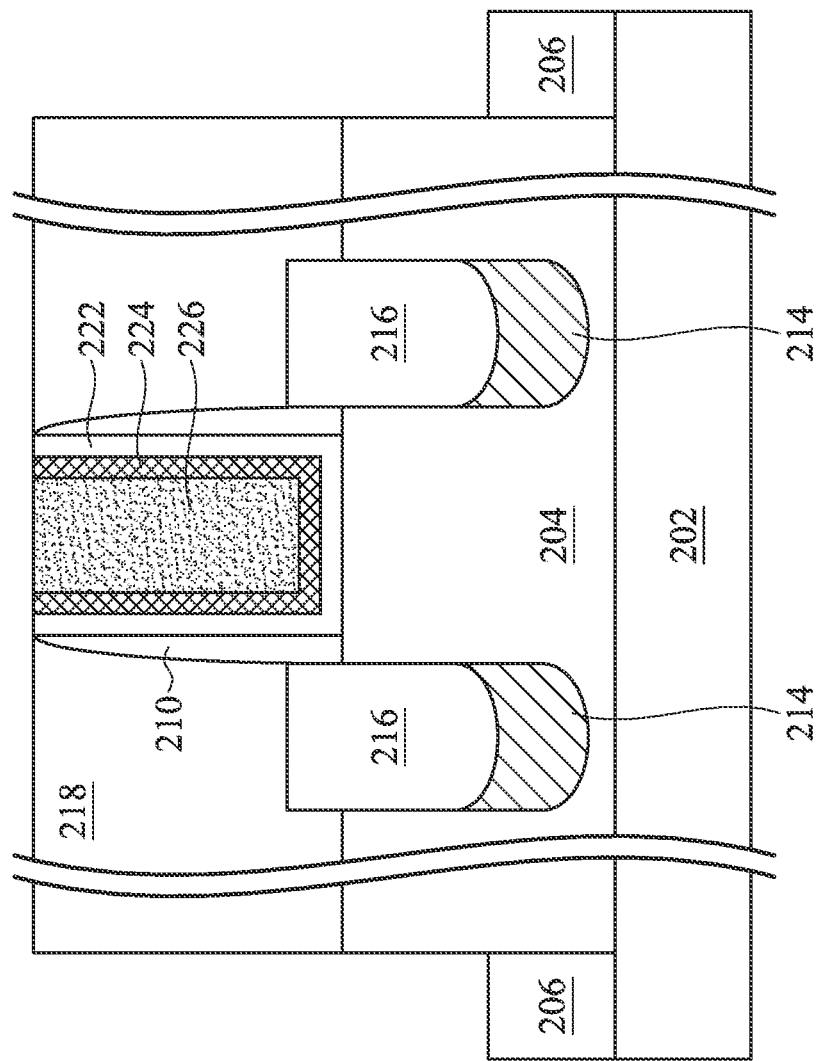
Figure 8C:
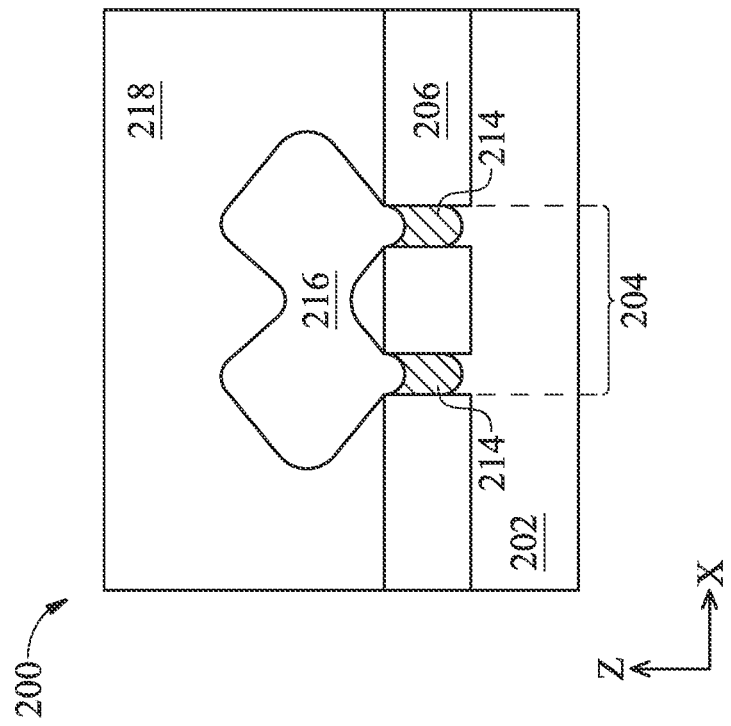
Figure 8D:
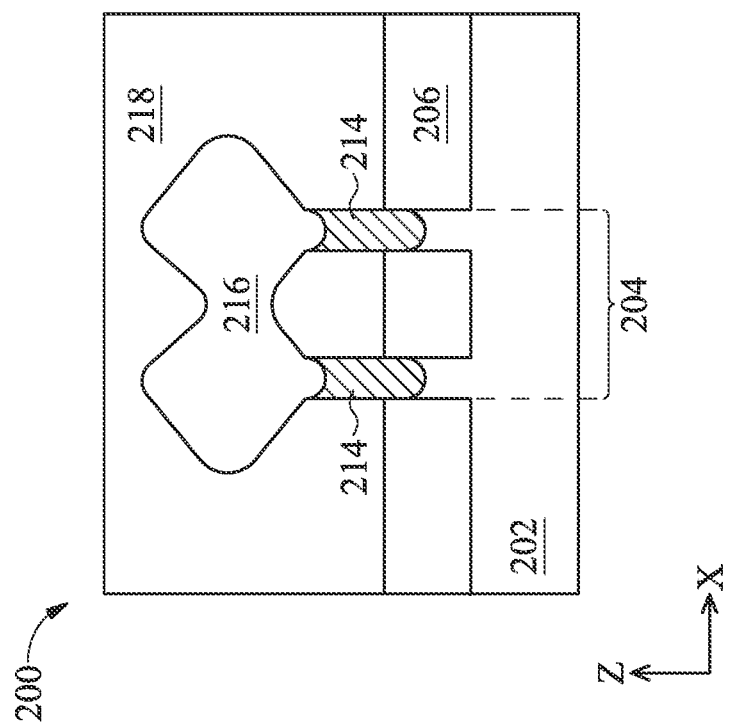
Figure 8E:
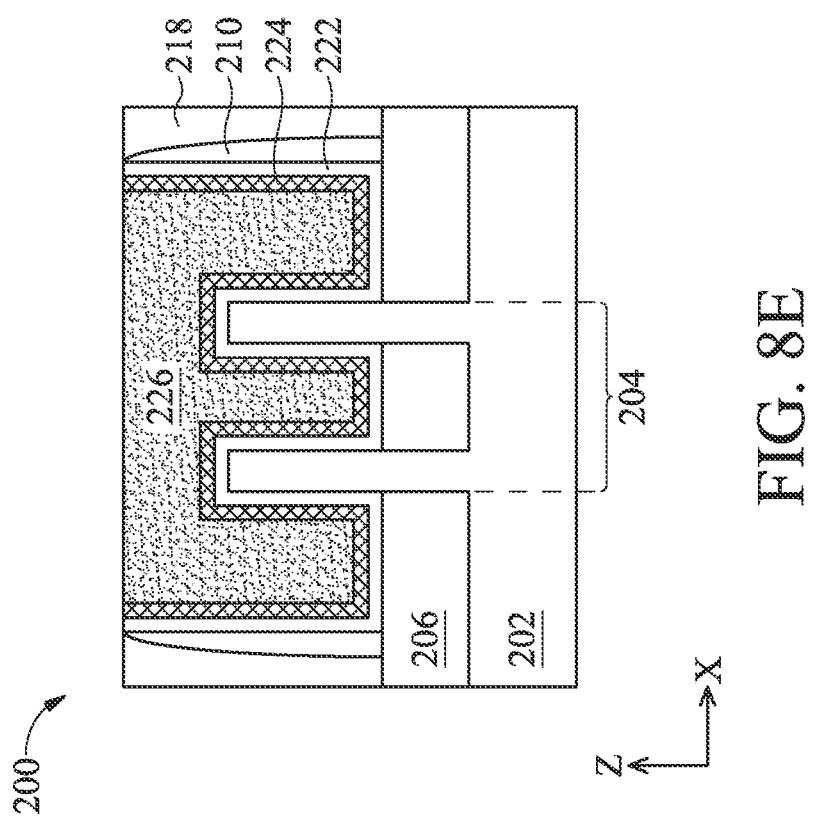

Now referring to FIGS. 1 and 7A-8E, the method 100 at operation 110 replaces the dummy gate structure 208 with an HKMG 220. Referring to FIGS. 7A-7C, the method 100 first forms an interlayer dielectric (ILD) layer 218 over the device 200. Though not depicted, in some embodiments, the method 100 deposits an etch-stop layer over the device 200 before forming the ILD layer 218. In some embodiments, the ILD layer 218 includes a dielectric material, such as a low-k dielectric material, tetraethylorthosilicate (TEOS), un-doped silicon oxide, doped silicon oxide such as boro-phosphosilicate glass (BPSG), fused silicate glass (FSG), phosphosilicate glass (PSG), boron-doped silicate glass (BSG), other suitable dielectric materials, or combinations thereof. The ILD layer 218 may include a single-layered structure or a multi-layered structure having multiple dielectric materials and may be formed by a deposition process such as, for example, CVD, FCVD, SOG, other suitable methods, or combinations thereof. Thereafter, the device 200 may be planarized by one or more CMP process to expose a top surface of the dummy gate structure 208. Subsequently, still referring to FIGS. 7A-7C, the method 100 removes the dummy gate structure 208 to form a gate trench 219 exposing the channel region of the fin 204. The method 100 may remove the dummy gate structure 208 by implementing an etching process, such as a dry etching process, a wet etching process, RIE, other suitable etching processes, or combinations thereof, using a patterned masking element exposing the dummy gate structure 208 as an etch mask. In some embodiments where an interfacial layer is formed between the polysilicon layer of the dummy gate structure 208 and the fin 204, the interfacial layer may remain in or alternatively removed from the gate trench 219 after the removal of the dummy gate structure 208. Thereafter, the patterned masking element is removed from the device 200 by any suitable method such as resist stripping, wet etching, and/or plasma ashing.

Now referring to FIGS. 8A-8E, the method 100 forms the HKMG 220 in the gate trench 219. The method 100 first deposits a high-k (having a dielectric constant greater than that of silicon oxide, which is about 3.9) gate dielectric layer 222 over the fin 204 (or over an interfacial layer if present) in the gate trench 219 and subsequently deposits at least one work function metal layer 224 over the high-k gate dielectric layer 222. The high-k dielectric layer 222 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable dielectric materials, or combinations thereof. The work function metal layer 224 may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer 224 includes multiple material layers of the same or different types in order to achieve a desired threshold voltage. Subsequently, the method 100 deposits a bulk conductive layer 226 over the work function metal layer 224, thereby filling the gate trench 219. The bulk conductive layer 226 may include copper (Cu), tungsten (W), cobalt (Co), ruthenium (Ru), aluminum (Al), other suitable conductive materials, or combinations thereof. The method 100 may then perform one or more CMP process to remove excess conductive material formed over the ILD layer 218 and planarize the top surface of the device 200. Though not depicted herein, the HKMG 220 may further include other material layers, such as an interfacial layer, a barrier layer, a glue layer, a hard mask layer, a capping layer, other suitable layers, or combinations thereof. The various layers of the HKMG 220 may be formed by any suitable method, such as CVD, ALD, PVD, plating, chemical oxidation, thermal oxidation, other suitable methods, or combinations thereof. In some embodiments, comparing FIGS. 8A with 8B (and 8C with 8D), the top surface of the dielectric layer 214 may be above or below the top surface of the isolation structures 206.

At operation 112, the method 100 may perform additional processing steps to the device 200. For example, multilayer interconnect features including vertical interconnect features such as contacts and/or vias, and/or horizontal interconnect features such as metal lines, may be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

The present disclosure provides methods of forming S/D features in semiconductor devices. Embodiments of the present disclosure include forming a trench in S/D regions of a semiconductor layer (e.g., a semiconductor fin) over which a dummy gate stack is formed between the S/D regions and forming a dielectric layer in the trench such that a top surface of the dielectric layer is below a top surface of semiconductor layer. Subsequently, embodiments of the present disclosure form an epitaxial S/D feature over the dielectric layer in the trench before replacing the dummy gate stack with a metal gate stack. In some embodiments, the epitaxial S/D feature are doped with one or more suitable dopant for forming a p-type or an n-type S/D feature. In some embodiments, the top surface of the dielectric layer is above a top surface of isolation structures formed adjacent to the semiconductor layer. In alternative embodiments, the top surface of the dielectric layer is below the top surface of isolation structures surrounding the semiconductor layer. In some embodiments, in order to accommodate the proper growth of the epitaxial S/D features, forming the epitaxial S/D features includes implementing more than one deposition processes to ensure proper growth and performance of the epitaxial semiconductor layer over the dielectric layer.

Although not intended to be limiting, one or more embodiments of the present disclosure provide many benefits to a semiconductor device and the formation thereof. For example, a dielectric layer deposited below epitaxial S/D features in the S/D regions of a device serve to impede potential diffusion of dopants between bottom portions of the epitaxial S/D features, thereby preventing the leakage of current and/or mitigating short-channel effects (SCEs) such as drain-induced barrier lowering (DIBL).

In one aspect, the present disclosure provides a method of fabricating a semiconductor structure that begins with forming a dummy gate structure over a semiconductor layer and forming a trench in the semiconductor layer adjacent to the dummy gate structure. Then, the method proceeds to forming a dielectric layer in the trench such that a top surface of the dielectric layer is below a top surface of the semiconductor layer, and subsequently forming an epitaxial source/drain (S/D) feature over the dielectric layer in the trench. Thereafter, the method proceeds to replacing the dummy gate structure with a metal gate structure.

In another aspect, the present disclosure provides a semiconductor structure that includes a fin disposed over a semiconductor substrate, a high-k metal gate structure (HKMG) disposed over the fin, where the HKMG traverses a channel region of the fin, an S/D feature disposed in the fin, and a dielectric layer disposed in the fin and below the S/D feature, where a top surface of the dielectric layer is defined by a bottom surface of the S/D feature. In some embodiments, the S/D feature includes a top portion disposed over a bottom portion, where the top portion and the bottom portion have different compositions In yet another aspect, the present disclosure provides a semiconductor structure that includes a semiconductor fin disposed over a substrate, a metal gate stack disposed over the semiconductor fin, an epitaxial S/D feature disposed over the semiconductor fin and adjacent to the metal gate stack, and a dielectric feature embedded in the semiconductor fin, where a bottom surface of the epitaxial S/D feature is disposed on a top surface of the dielectric feature, and where sidewalls of the epitaxial S/D feature extend to define sidewalls of the dielectric feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece comprising:
a first fin-shaped active region and a second fin-shaped active region protruding from a substrate and extending along a first direction;
an isolation feature disposed over the substrate and disposed between the first and second fin-shaped active regions, wherein a top surface of the first fin-shaped active region is above a top surface of the isolation feature;
forming a dummy gate structure over channel regions of the first and second fin-shaped active regions, wherein the dummy gate structure extends along a second direction perpendicular to the first direction;
forming a trench in the first fin-shaped active region adjacent the dummy gate structure;
forming a dielectric layer in the trench, wherein, in a cross-sectional view defined by the second direction and a vertical direction, a top surface of the dielectric layer is below the top surface of the isolation feature;
forming an epitaxial source/drain (S/D) feature over the dielectric layer and in the trench, wherein forming the epitaxial S/D feature includes forming a buffer layer over the dielectric layer and forming an epitaxial layer over the buffer layer, and wherein the buffer layer is un-doped; and
after forming the epitaxial S/D feature, replacing the dummy gate structure with a metal gate structure.

2. The method of claim 1, wherein forming the dielectric layer includes:
depositing a dielectric material in the trench; and
subsequently removing a top portion of the dielectric material to form the dielectric layer.

3. The method of claim 2, wherein depositing the dielectric material includes depositing silicon oxide in the trench.

4. The method of claim 1, wherein the dielectric layer includes an amorphous material and the buffer layer includes a crystalline material.

5. The method of claim 1, wherein forming the buffer layer is implemented by a first deposition process and forming the epitaxial layer is implemented by a second deposition process that is different from the first deposition process.

6. The method of claim 5, wherein the first deposition process is an atomic layer deposition (ALD) process implemented without an in-situ doping process, and wherein the second deposition process is an atomic layer deposition process implemented with an in-situ doping process.

7. The method of claim 1, further comprising performing a cleaning process to the top surface of the dielectric layer before forming the epitaxial S/D feature.

8. A method, comprising:
providing a semiconductor structure including a dummy gate intersecting a first semiconductor fin and a second semiconductor fin;
forming a first source/drain (S/D) recess in the first semiconductor fin and a second S/D recess in the second semiconductor fin adjacent the dummy gate;
forming a first dielectric layer and a second dielectric layer to partially fill the first S/D recess and the second S/D recess, respectively;
forming first and second epitaxial S/D features in the first and second S/D recesses and on the first and second dielectric layers respectively, wherein the first epitaxial S/D feature comprises an epitaxial semiconductor layer and an undoped semiconductor layer surrounding a bottom surface and a lower part of a sidewall surface of the epitaxial semiconductor layer, and the undoped semiconductor layer is in direct contact with the first dielectric layer; and
replacing the dummy gate with a metal gate adjacent the first and second epitaxial S/D features.

9. The method of claim 8, wherein forming the first dielectric layer includes:
depositing a dielectric material over the semiconductor structure to completely fill the first S/D recess; and
removing a portion of the dielectric material, such that a top surface of the first dielectric layer is below a top surface of the first semiconductor fin.

10. The method of claim 8, wherein the first dielectric layer includes amorphous silicon oxide.

11. The method of claim 8, further comprising performing a cleaning process to a top surface of the first dielectric layer before the forming of the first and second epitaxial S/D features.

12. The method of claim 8, wherein the forming of the second epitaxial S/D feature comprises depositing a buffer layer by implementing an atomic layer deposition (ALD) process without an in-situ doping process and depositing an epitaxial layer over the buffer layer by implementing an ALD process with an in-situ doping process.

13. The method of claim 8, wherein the semiconductor structure further includes an isolation structure surrounding the first and second semiconductor fins, wherein forming the first dielectric layer results in a top surface of the first dielectric layer to be above a top surface of the isolation structure.

14. The method of claim 8, wherein the semiconductor structure further includes an isolation structure surrounding the first and second semiconductor fins, wherein forming the first dielectric layer results in a top surface of the first dielectric layer to be below a top surface of the isolation structure.

15. A method, comprising:
forming a dummy gate over a semiconductor layer;
etching the semiconductor layer to form a trench adjacent the dummy gate;
forming a dielectric feature in the trench, wherein the dielectric feature comprises a concave top surface;
forming an epitaxial source/drain (S/D) feature over the dielectric feature and in and over the trench, including:
depositing a first semiconductor layer in the trench, wherein the first semiconductor layer comprises a sidewall portion extending along sidewalls of the trench and a bottom portion on the concave top surface of the dielectric feature, wherein the first semiconductor layer is free of any dopant, and
depositing a second semiconductor layer over the first semiconductor layer to form the epitaxial S/D feature, wherein the second semiconductor layer includes a dopant, and wherein the first semiconductor layer surrounds a bottom surface and a sidewall surface of a lower part of the second semiconductor layer formed in the trench; and
forming a metal gate in place of the dummy gate adjacent the epitaxial S/D feature.

16. The method of claim 15, wherein forming the dielectric feature includes:
depositing a dielectric layer to completely fill the trench; and
recessing a portion of the dielectric layer, resulting in a top surface of the dielectric feature to be below a top surface of the semiconductor layer.

17. The method of claim 16, wherein the dielectric layer includes amorphous silicon oxide.

18. The method of claim 15, wherein the first semiconductor layer and the second semiconductor layer include a same semiconductor material.

19. The method of claim 15, further comprising performing a cleaning process to a top surface of the dielectric feature before forming the epitaxial S/D feature.

20. The method of claim 1, wherein the top surface of the dielectric layer is a concave top surface.

* * * * *